(12) United States Patent
Zavadsky et al.

(10) Patent No.: US 7,899,640 B2
(45) Date of Patent: Mar. 1, 2011

(54) INTEGRATED CIRCUIT CHARACTERISATION SYSTEM AND METHOD

(75) Inventors: Vyacheslav L. Zavadsky, Ottawa (CA); Mykola Sherstyuk, Ottawa (CA)

(73) Assignee: Semiconductor Insights Inc., Kanata (CA)

( * ) Notice: Subject to any disclaimer, the term of this patent is extended or adjusted under 35 U.S.C. 154(b) by 264 days.

(21) Appl. No.: 12/183,298

(22) Filed: Jul. 31, 2008

(65) Prior Publication Data
US 2010/0030497 A1 Feb. 4, 2010

(51) Int. Cl.
*G06F 11/26* (2006.01)
*G06F 11/00* (2006.01)

(52) U.S. Cl. .......... 702/119; 702/117; 702/118; 714/742

(58) Field of Classification Search .................. 702/119, 702/117, 118
See application file for complete search history.

(56) References Cited

U.S. PATENT DOCUMENTS

2003/0200046 A1* 10/2003 Corr .............................. 702/117
2006/0031792 A1* 2/2006 Zavadsky et al. ................. 716/4
2007/0256037 A1* 11/2007 Zavadsky et al. ................. 716/2

* cited by examiner

*Primary Examiner* — Hal D Wachsman
(74) *Attorney, Agent, or Firm* — John W. LaBatt; Hoffman Warnick LLC

(57) ABSTRACT

There is presented a system and method for characterizing an integrated circuit (IC) for comparison with a pre-defined system-level characteristic related to an aspect of IC operation, wherein a test procedure on the IC that invokes this aspect is executed, while at least one operational bottleneck is invoked to constrain operation of the IC to exhibit a system-level operation thereof related to the aspect. Data generated via the test procedure in response to the bottleneck is collected and the system-level operation exhibited thereby is compared for consistency with the pre-defined system-level characteristic.

23 Claims, 7 Drawing Sheets

INTEGRATED CIRCUIT CHARACTERISATION SYSTEM AND METHOD

FIELD OF THE INVENTION

The invention generally relates to integrated circuits and, in particular, to an integrated circuit characterization system and method.

BACKGROUND

The various features, structures and/or attributes of an integrated circuit (IC) are regularly textually described in various types of documentation. For example, various descriptive documents may be used to profess the merits and/or benefits of an IC over prior versions thereof or over a competitor's product. Examples of such descriptive documents may include, but are not limited to, marketing materials, ad campaigns, user manuals and technical specifications, purchase and/or manufacturing agreements, research and development progress reports, intellectual property documents, and the like.

In certain situations, it may become useful or necessary to evaluate the validity of such assertions, or again to investigate whether a competing product also exhibits similar attributes. For instance, a manufacturer's claims to a specific IC characteristic may be questioned for compliance with one or more performance standards or product accreditations, or again verified in the context of a quality control procedure, or explored in competitive research. Alternatively, such characteristics may be the subject of a legal action, for instance in a matter relating to intellectual property associated with a given product. For example, a first party owning the rights to any IC having certain characteristics as defined by one or more patent claims may seek to investigate a competitor's product to assess whether there is infringement of these claims by the commercialization of this product. In this example, evidence is generally required of the use of the claimed subject matter, with such evidence generally being collected from one or more products that were acquired in the open market.

Following from the last example, the patents (or other descriptive documents as discussed above) in the field of microelectronics for which support is desired may claim particular circuits and/or structures. Often support for such claims is obtained using traditional reverse engineering means, as will be apparent to the skilled artisan, where circuitry and/or structural detail of an IC are "extracted" therefrom.

Techniques for extracting circuits from an IC will be apparent to the skilled artisan. In general, the circuit of interest generally has fewer than 10,000 gates. In such cases the circuit or circuits are extracted from the finished product (i.e. the circuits are derived from the physical layout of circuit elements on one or more layers of the IC), a schematic diagram is developed and a determination is made as to whether the schematic diagram provides for a circuit as claimed.

The techniques of de-layering and extracting circuits become more difficult when the circuit in question has more than the above number of gates. It is, however, the case that circuitry with such a number of gates is sufficient to provide for particular features of operation of the IC. Namely, the presence of this circuitry within an IC may provide for particular functionality of the IC.

There are therefore situations where support for claimed subject matter (or statements in other descriptive documentation as discussed above) cannot be readily derived using traditional methods of circuit extraction through reverse engineering. One particular example of such situations includes, but is not limited to, so-called system-level features of the operation of an IC. Namely, the determination of the system-level operation of an IC that is in a finished state becomes difficult if not impossible using conventional methods. Furthermore, while various benchmark testing procedures have been made available to compare the performance of similar ICs under different conditions, such tests do not allow for the observation of the system-level operation of such ICs, but rather, only provide observation as to the global performance of the IC under different operational loads. Accordingly, while one may determine that two ICs perform in a similar manner in different conditions, such testing procedures do not enable one to observe the system-level operation of the IC enabling such performance. In addition, traditional performance testing procedures are generally implemented using conventional operating systems wherein, in many cases, this operating system (OS) may mask the native operation thereof, thereby further obscuring the native system-level operations of interest.

There is therefore a need for a new IC characterisation system and method that overcomes some of the drawbacks of known techniques.

SUMMARY OF THE INVENTION

An object of the invention is to provide an IC characterization system and method.

In accordance with one aspect of the invention, there is provided a method of characterizing an integrated circuit (IC) for comparison with a pre-defined system-level characteristic related to an aspect of IC operation, the method comprising the steps of executing a test procedure on the IC that invokes the aspect; invoking at least one operational bottleneck during the executing step to constrain operation of the IC to exhibit a system-level operation thereof related to the aspect; collecting data generated via said test procedure in response to said bottleneck; and comparing the system-level operation exhibited by the data for consistency with the pre-defined system-level characteristic.

In accordance with another aspect of the invention, there is provided a system for characterizing an integrated circuit (IC) for comparison with a pre-defined characteristic related to an aspect of IC operation, the system comprising: a computer-readable medium comprising statements and instructions for execution by the system on the IC to implement a test procedure configured to invoke the aspect, while invoking at least one operational bottleneck to constrain operation of the IC to exhibit a system-level operation thereof related to the aspect; a data storage device for collecting data generated via the test procedure in response to the bottleneck; and an output for enabling comparison of the system-level operation exhibited by the data for consistency with the pre-defined characteristic.

In accordance with another aspect of the invention, there is provided a computer-readable medium comprising statements and instructions for execution by an integrated circuit (IC) for characterizing the IC for comparison with a pre-defined characteristic related to an aspect of IC operation in accordance with the following steps of: executing a test procedure on the IC configured to invoke the aspect; invoking at least one operational bottleneck during the executing step to constrain operation of the IC to exhibit a system-level operation thereof related to the aspect; collecting data generated via the test procedure in response to the bottleneck; and accessing the data to enable comparison of the system-level operation exhibited thereby for consistency with the pre-defined operational characteristic.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION OF THE INVENTION

Figure 1:
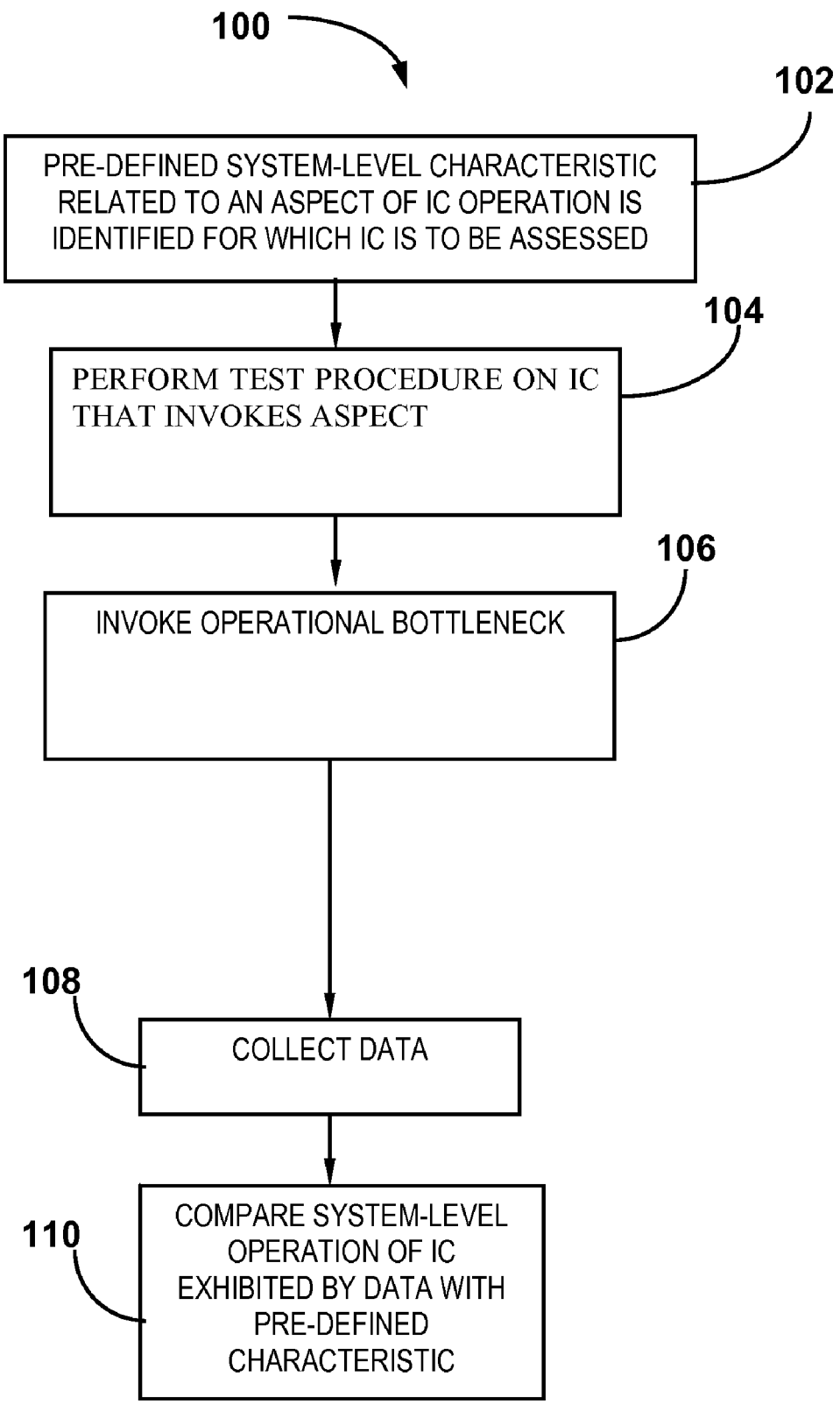
FIG. 1 is a flow chart of an IC characterization method, in accordance with one embodiment of the invention.

For purposes of explanation, exemplary embodiments are set forth to provide a thorough understanding of the invention. However, it will be understood by the skilled artisan, from reading this disclosure, that the invention may be practiced without these specific details. Moreover, well-known elements, devices, process steps and the like are not set forth-in detail in order to avoid obscuring the scope of the invention described.

Unless defined otherwise, all technical and scientific terms used herein have the same meaning as commonly understood by one of ordinary skill in the art to which this invention belongs.

In general, there is provided an IC characterization method and system, for example, for extracting (e.g. reverse engineering) one or more system-level operations of an IC, and in some embodiments, for comparing such operation with proposed, stated and/or claimed operational characteristics to be associated with such ICs. For instance, the methods and systems described herein may be used, in accordance with one embodiment, in determining the system-level operation of a given IC for the purposes of comparing such operation to those recited in a descriptive document related to such ICs. For example, these characteristics may be recited by the claims of a patent from which protection is conferred, wherein the patentee may wish to evaluate certain system-level operations of a commercially available IC in comparison with these claimed characteristics. Therefore, in one embodiment, the method and system may be used to enable or assist a patentee to assert their rights in one or more IC designs, or one or more operational characteristics thereof, over an alleged infringer whose marketed ICs exhibit substantially same or similar operations.

In general, the operational characteristics contemplated herein are those associated with one or more features of the system-level operation of an IC. For instance, as will be appreciated by the person of ordinary skill in the art, "system-level" features generally include features that are more complex than simple logic functions, such as those readily know by the person of ordinary skill in the art to be associated with standard logic elements as may be found in the IC. For example, in one embodiment, such system-level operation may result from a large functional block of circuitry, from low-level firmware or the like, operating on the IC and providing one or more functions associated with a general aspect of the IC's operation (e.g. power management, memory management and access, etc.). Examples of low-level system functionality may include, but are not limited to, operations such as cache management algorithms, translation look-aside buffer (TLB) algorithms, bus request arbitration processes, memory request queues, a unit's power management, and the like, as will be apparent to the person of skill in the art. It is noted that such functionality is generally not documented in literature associated with a given IC. The methods and systems of the invention therefore enable one to access such functionality, which may not be readily available from the IC supplier or manufacturer. Similarly, even when such documentation is available from the supplier or manufacturer, the methods and systems of the invention may enable one to verify such functionality to validate assertions made by this documentation.

In some embodiments, higher system-level functionality may also, or alternatively be considered. For example, a higher system-level functionality may include operation of an instruction set and control registers of a microprocessor. Other examples, which may include, but are not limited to, operation of instruction sets, memory control units, registers, control registers, bus specs, etc., may also be considered herein without departing from the general scope and nature of the present disclosure, as should be apparent to the skilled artisan. While such high system-level functionality can be documented, and therefore comparatively analysed from such documentation, methods and systems as described herein may nonetheless be used either to complement, or as an alternative to, a comparative documentation analysis.

As will be described in greater detail below, various embodiments of the invention enable for a characterization of the native operation of an IC, that is, system-level operations native to the IC's original conception and design. For the purposes of these embodiments the features of operation associated with the native operation are considered as those features of operation that are determined by low-level aspects of the operation of the IC, including its circuitry and any firmware operating thereon, or a combination thereof.

Generally the native operation of an IC may be obscured by higher-level software operating on the IC. Examples of software that might obscure the native operation may include, but are not limited to, the operating system (OS), basic input/output system (BIOS) or higher level software that may be operating on the IC. In particular, the above software may impose functionality similar to, or which would otherwise override, the native operation of the IC. In addition to possibly obscuring the native operation of the IC, the OS may inhibit the ability to test the operation of the IC. In particular, the OS may limit the ability to program lower-level operations and may lead to instabilities in the operation of the IC if testing of the IC is undertaken.

Accordingly, some embodiments may be configured to mitigate situations wherein the system-level aspects of the IC's operation are obscured by one or more layers of software executing on the IC. In such embodiments, a system and method are provided for observing, either directly or indirectly, the desired system-level operations of the IC via the provision of an appropriate operating environment.

Referring now to FIG. 1, and in accordance with one embodiment of the invention, a method 100 for characterizing an integrated circuit will be described. In general, the method 100 provides for the characterization of the IC to observe one or more system-level operations thereof for comparison with a pre-defined system-level operational characteristic relating to a same or similar aspect of IC operation. As discussed above, this pre-defined characteristic may be defined in the context of a descriptive document, or in other contexts as will be readily apparent to the person of ordinary skill in the art. As depicted in FIG. 1, a system-level characteristic relating to an aspect of IC operation is first identified (step 102). A test procedure to invoke the aspect is then performed thereon (step 104) while invoking at least one operational bottleneck (step 106) to constrain operation of the IC to exhibit a system-level operation thereof related to this aspect. Data generated via the test procedure in response to the bottleneck is then collected (step 108), and the system-level operation exhibited thereby is compared (step 110) for consistency with the pre-defined characteristic.

Figure 2:
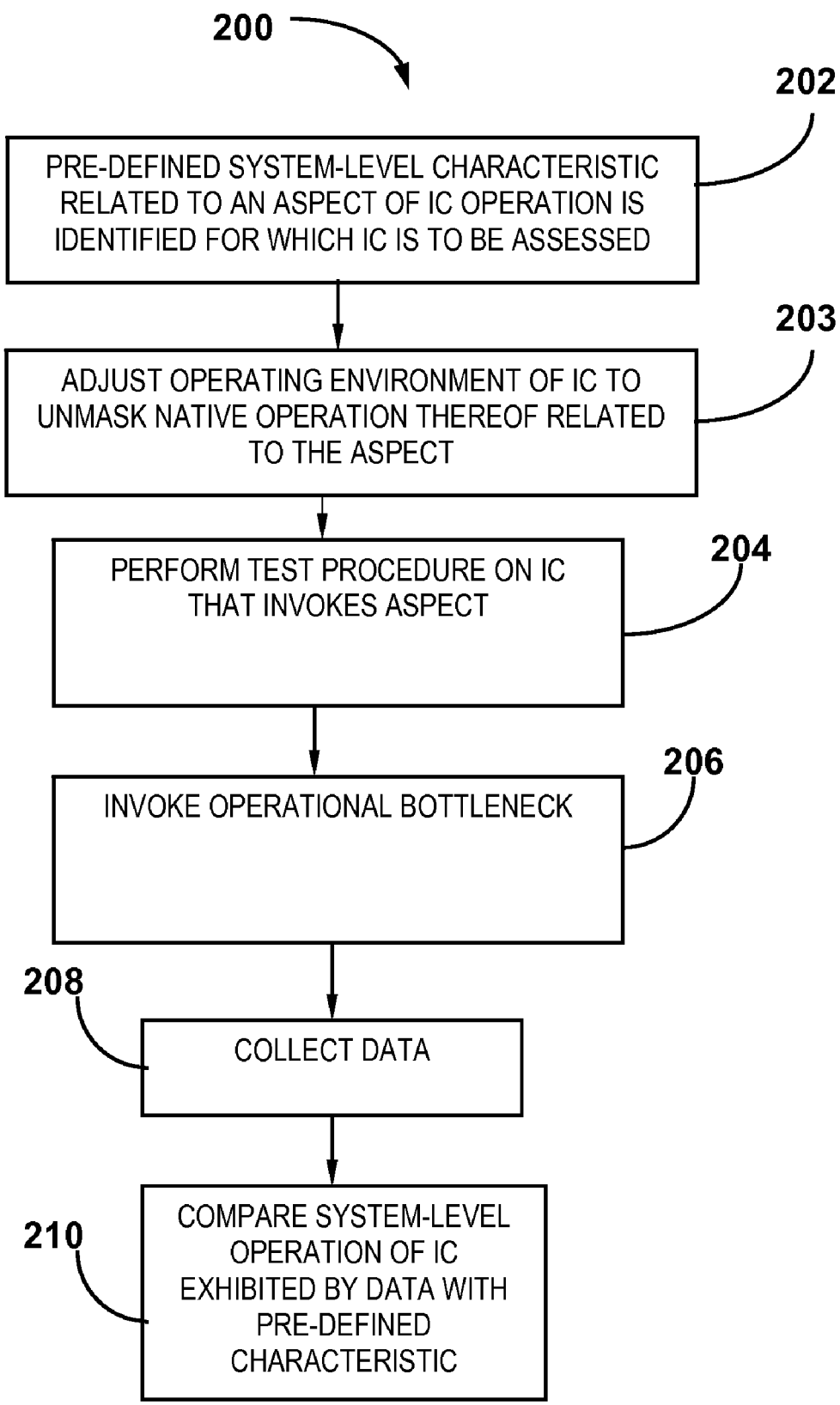
FIG. 2 is a flow chart of an IC characterization method, in accordance with another embodiment of the invention, wherein an operating environment of the IC is adjusted in order to unmask a native operation thereof.

With reference to FIG. 2, and in accordance with another embodiment of the invention, a similar characterization method 200 is provided, wherein a native operation of the IC is masked or otherwise obscured by the operating environment of the IC. For example, the "environment" may be considered to include conditions under which the IC is operating, such as provided by an OS operating thereon, and/or other such software, firmware as will be readily apparent to the person skilled in the art. This environment may thus obscure some of the system-level operations (i.e. skew performance measures related thereto or affected thereby) of interest. In this case the environment under which the IC is operating would need to be altered to collect the required data. Accordingly, once the pre-defined system level characteristic is identified in step 202, the operating environment of the system may be adjusted at step 203 (e.g. adjust OS to provide OS-free or substantially OS-free operation, disable peripheral devices, drivers, interrupts, etc.) such that performance of the test procedure (step 204) is implemented in this adjusted operating environment. Accordingly, by invoking the operational bottleneck (step 206) within these conditions, and collecting data (step 208) generated via the test procedure in response to this bottleneck, comparison of the system-level operation of the IC with the pre-defined characteristic may be facilitated.

Figure 3:
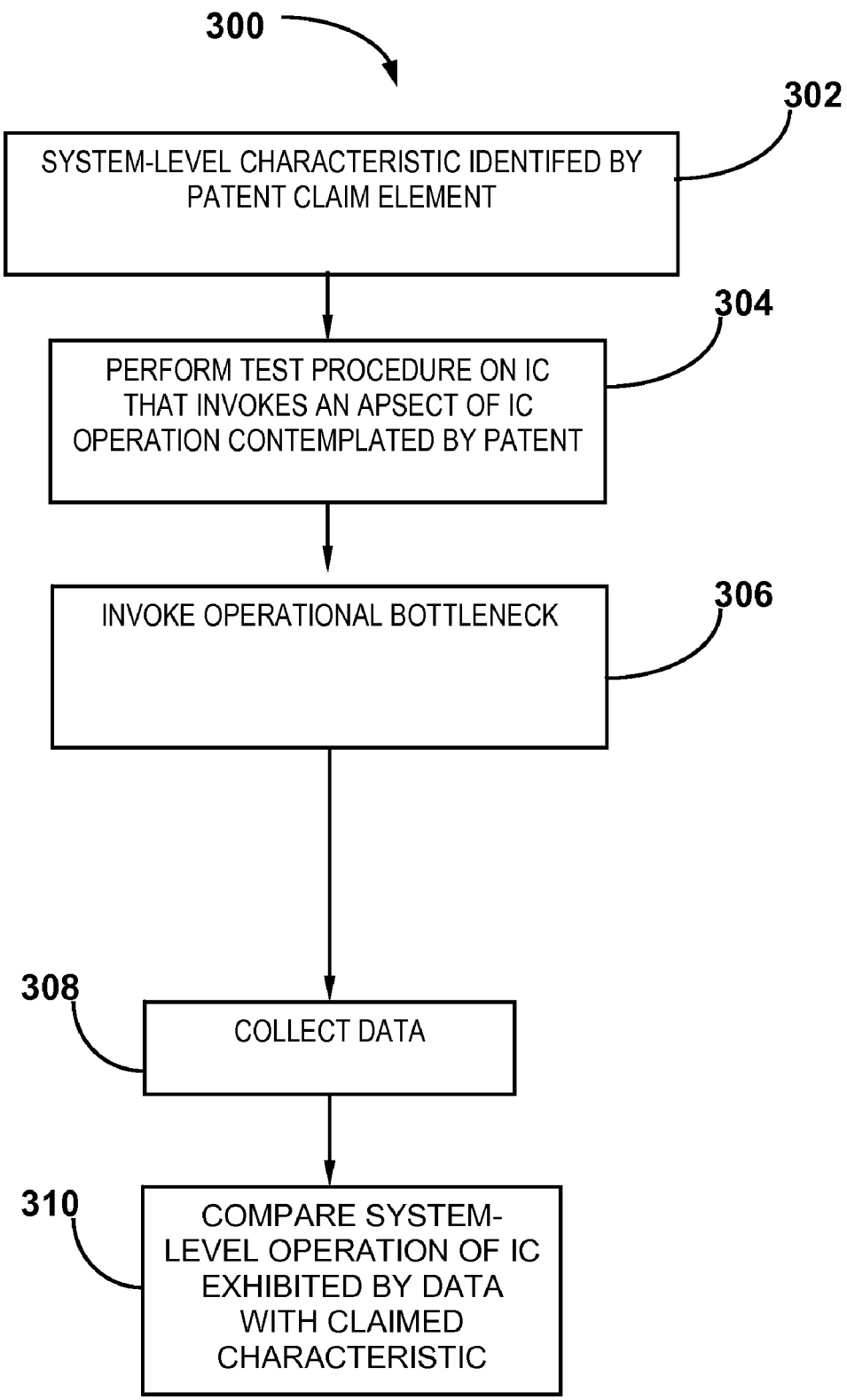
FIG. 3 is a flow chart of an IC characterization method for supporting a patent claim, in accordance with one embodiment of the invention.

With reference to FIG. 3, and in accordance with another embodiment of the invention, an IC characterization method 300 for supporting one or more patent claims is presented. In general an analyst who is analyzing a particular patent and IC of interest may implement the method 300 in order to assess whether a claimed system-level characteristic is manifested by the system-level operation of the IC in question. At step 302, the system-level characteristic defined by the patent claim is identified. At step 304, a test procedure is implemented on the IC to invoke aspects of the IC operation contemplated by the patent, while invoking, at step 306, an operation bottleneck constraining operation of the IC to exhibit a system-level operation of the IC. At step 308, data is collected and the system-level operation of the IC exhibited thereby is compared at step 310 with the claimed characteristic.

As with the embodiment described above with reference to FIG. 2, the present embodiment may further include a determination as to whether the system-level operation of interest (e.g. native operation) can be measured and/or invoked directly (e.g. under normal operating conditions/environment) or whether adjustment to the operating environment need be provided to further highlight the operation of interest.

In selecting and/or implementing the test procedure, various considerations may be brought forth, as will be apparent to the person skilled in the art. For instance, while the test procedure is generally configured to invoke the aspect of IC operation to which the pre-defined characteristic relates, it may also be configured or optimized to trigger performance measures that might better highlight the system-level operations of interest, thereby facilitating comparison thereof with the pre-defined characteristic. In addition, the test procedures may be configured to generate side-channel information/data to observe the IC operation. Examples of such side-channel information may include, but are not limited to, signals, power consumption, RF frequency, timings, temperatures (e.g. operating temperatures, temperature distributions, etc.) and the like.

Figure 4:
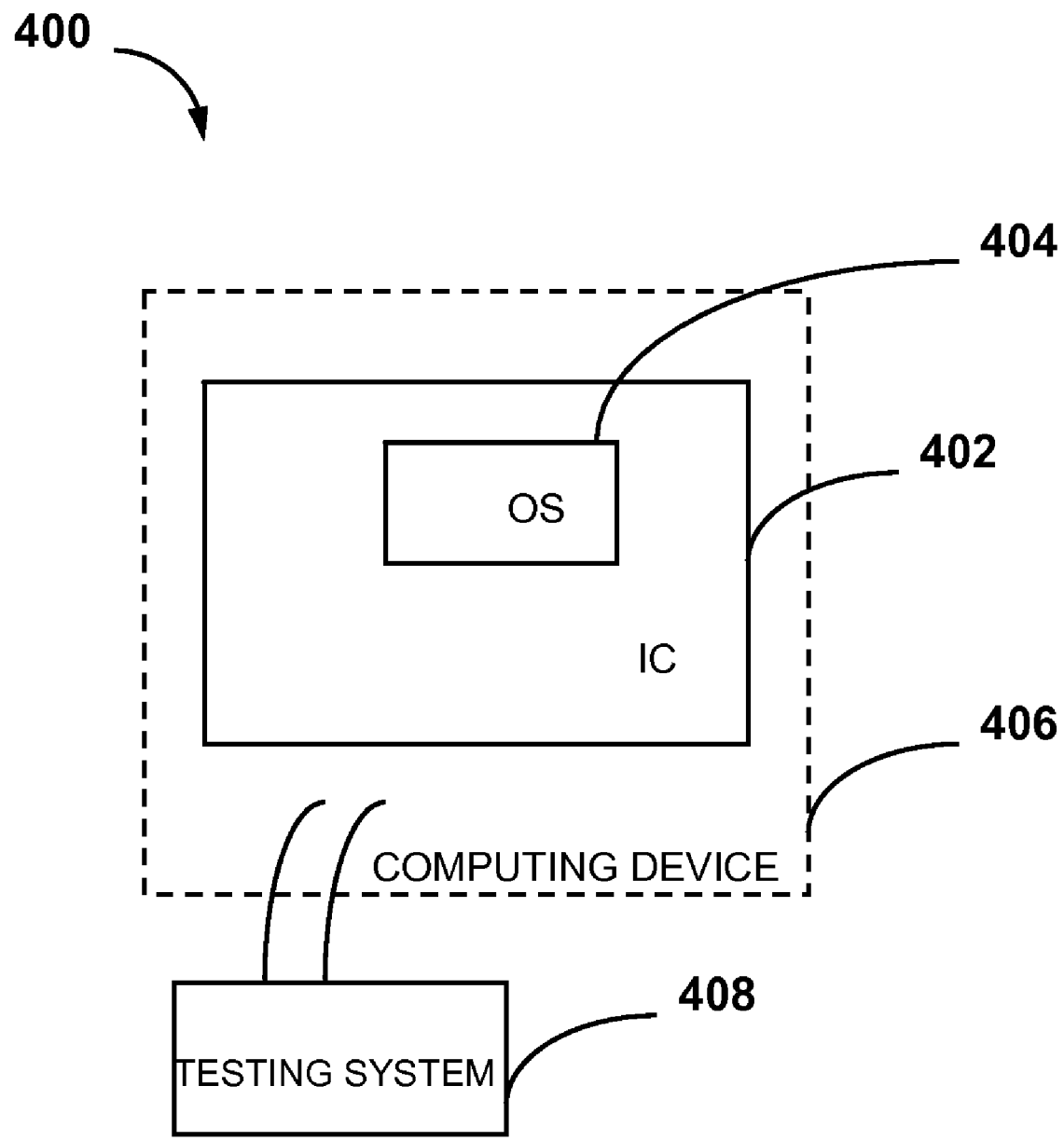
FIG. 4 is a schematic block diagram of a system for characterizing an IC, in accordance with one embodiment of the invention.

With reference to FIG. 4, and in accordance with one embodiment of the invention, a system 400 for characterizing an IC 402 to assess a system-level operation thereof will now be described. In this embodiment, the system 400 is configured to operate within an OS-free (or substantially OS-free) environment. IC 402 may generally consist of any IC capable of running an operating system, however, in the current embodiment, IC 402 comprises a microprocessor having multiple processing cores and a cache memory that is shared between these cores. The processor cores, cache and other features of the microprocessor, as will be apparent to the skilled artisan, are not depicted in FIG. 4. The IC 402 is running OS 404 thereon. While FIG. 4 depicts OS 404 as being located within IC 402, it will be apparent to the skilled artisan that the OS 404 is more likely to be physically located on some form of non-volatile memory, including but not limited to, a hard disk drive or an appropriate solid state memory. In this embodiment, the IC 402 is located within a computing device or system 406, which the person of ordinary skill in the art will appreciate, may include different types of devices executing various test procedures on the IC, for example. In this particular embodiment, the system 406 comprises a PC and the OS 404 comprises a Linux based OS which is customized to collect side-channel information, such as timing of particular tests. The operation of the IC 402 is monitored by a testing system 408. The testing system 408 is appropriate for monitoring the operational measures of IC 402. It is noted that the connection of IC 402 and test system 408 as depicted in FIG. 4 is simply representational and does not necessarily infer the actual form of the connection between the two. For example, the test system 408 may be implemented integrally to the processing system 406, or distinctly as part of an independent device. It will be appreciated by the person of skill in the art that these and other such variations are to be considered within the scope of the present disclosure.

Figure 5A:
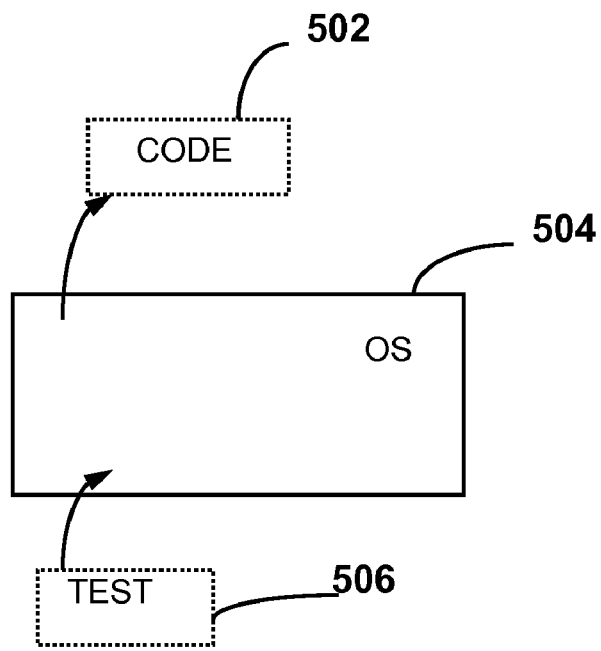
FIG. 5A is a schematic block diagram of a system for characterizing an IC, in accordance with another embodiment of the invention.

FIG. 5A provides further details as to the manner in which an OS 504 may be adjusted when necessary, in accordance with one embodiment of the invention. As introduced above, the OS 504 should generally not modify the operation of the IC in a manner that would mask and/or alter the system-level operations thereof that one is interested in observing. Accordingly, the OS 504 may therefore have elements of code 502 that might modify and/or obscure the operation of the IC removed, as appropriate. The OS 504 may further be modified by the addition of code elements 506. The elements 506 might include, for example, test procedures that might highlight the features of the operation of IC that are of interest.

Figure 5B:
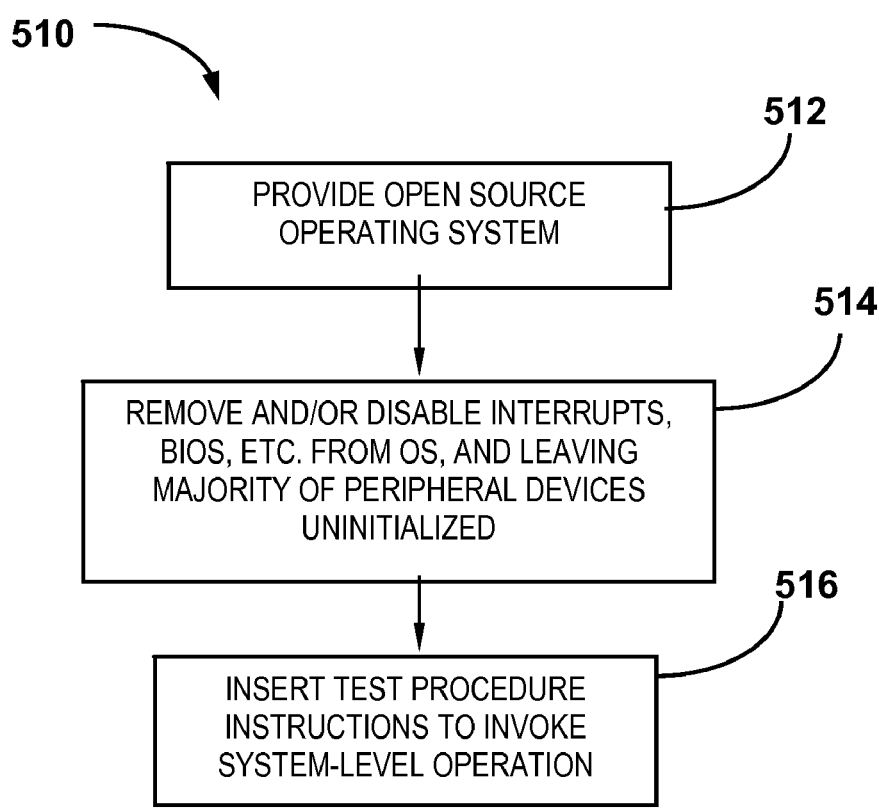
FIG. 5B is a flow chart of a method for revising an open source operating system in order to implement an IC characterization method in accordance with one embodiment of the invention.

With reference to FIG. 5B, and in accordance with one embodiment of the invention, a method 510 is provided for preparing or adjusting an OS for use in different embodiments of the invention where such adjustment is required or preferred in order to reduce or avoid masking the system-level operations of the IC of interest. An open source OS is provided at step 512, which in this embodiment may consist of a Linux OS. At step 514 the OS is modified to remove elements that might obscure the native operation of the IC being tested. At step 516, specific instructions are inserted into the OS to invoke the operational aspect to which the system-level operation(s) of interest are related. In this embodiment, the instructions introduced are further adapted to invoke an operational bottleneck that constrains operation of the IC to exhibit these system-level operations.

In this particular embodiment, the start_kernel( ) function of the Linux 2.6.x kernel is modified to inject a call to procedure to run the test procedure before hardware, device drivers, and OS scheduler are initialized. The output of the test procedure is done using the printk( ) function. The test procedure is designed to return the IC being tested to its pre-test mode and allow for the normal boot process of Linux. Upon initialization of the hard drive(s), controller device drivers, file system, scheduler and logger mechanism, Linux writes queued printk( ) outputs to the kernel log file, from where it can be accessed, and the system-level operation exhibited thereby compared to the pre-defined system-level characteristic in question.

The invention will now be described with reference to specific examples. It will be understood that the following examples are intended to describe embodiments of the invention and are not intended to limit the invention in any way.

In a first example, and in accordance with one embodiment of the invention, a method is provided to ascertain the system-level functionalities associated with the management of speculative memory requests within and between the multiple cores of an IC. For example, a method is provided for assessing whether a first processor core of a dual core processor will stop a speculative pre-fetch of instructions from a shared cache in the event that the second processor core generates a cache miss. To implement this method, the following exemplary test procedure was inserted into an open source OS, configured to operate in an OS-free, or substantially OS-free, environment:

```
for (I=0; I<50,000,000 /*large enough not to fit in cache/*; ++I)
{
access I-th memory page
for (j=0; j<N; ++j) NOP;
}
```

As will be appreciated by the skilled artisan, the above test procedure can provide a tremendous speed advantage by a speculative pre-fetching mechanism, which would allow fetching I+1 memory pages while no operation (NOPs) commands are executed. By executing this program with different parameter N on multiple cores simultaneously, one can highlight how the microprocessor manages conflicting memory fetch and pre-fetch requests originated on different cores.

For example, in one scenario, the following operational characteristic(s) is provided in a descriptive document or patent claim relating to cache access management in a dual core processor. In this scenario, when a first processor core creates a cache miss in L1, L1 forwards the request to L2. A 2 sector line request is then forwarded to the FSB interface and transfer of the missed segment from memory to L2 is initiated. When the second processor core creates a cache miss in L1, L1 again forwards the request to L2 and a 2 sector lines request is forwarded to the FSB interface. If the first transaction is attributed with a high priority (immediate miss), then transfer of an adjacent cache line is initiated therefor. Otherwise, if the second processor, as a second FSB agent, requests ownership of the FSB, then the first transaction will be stopped and the second enabled to proceed.

In order to constrain operation of the IC to exhibit such system-level operation, the test procedure is implemented in an OS free environment, with interrupts disabled and the majority of peripheral devices not initialized. Further, all other data pre-fetching mechanisms (e.g. data pre-fetch logic—DPL, etc.) are turned off. In this particular example, the test procedure was always executed on the first core, with the second core either a) idling or b) continuously reading independent 64 MB arrays of data, thus constantly producing cache misses. Consequently, a bottleneck is generated to constrain operation of the processor in a manner enabling exhibition of the system-level operation of interest, namely, by monitoring the program execution throughput with different cache settings, as discussed below.

Figure 6:
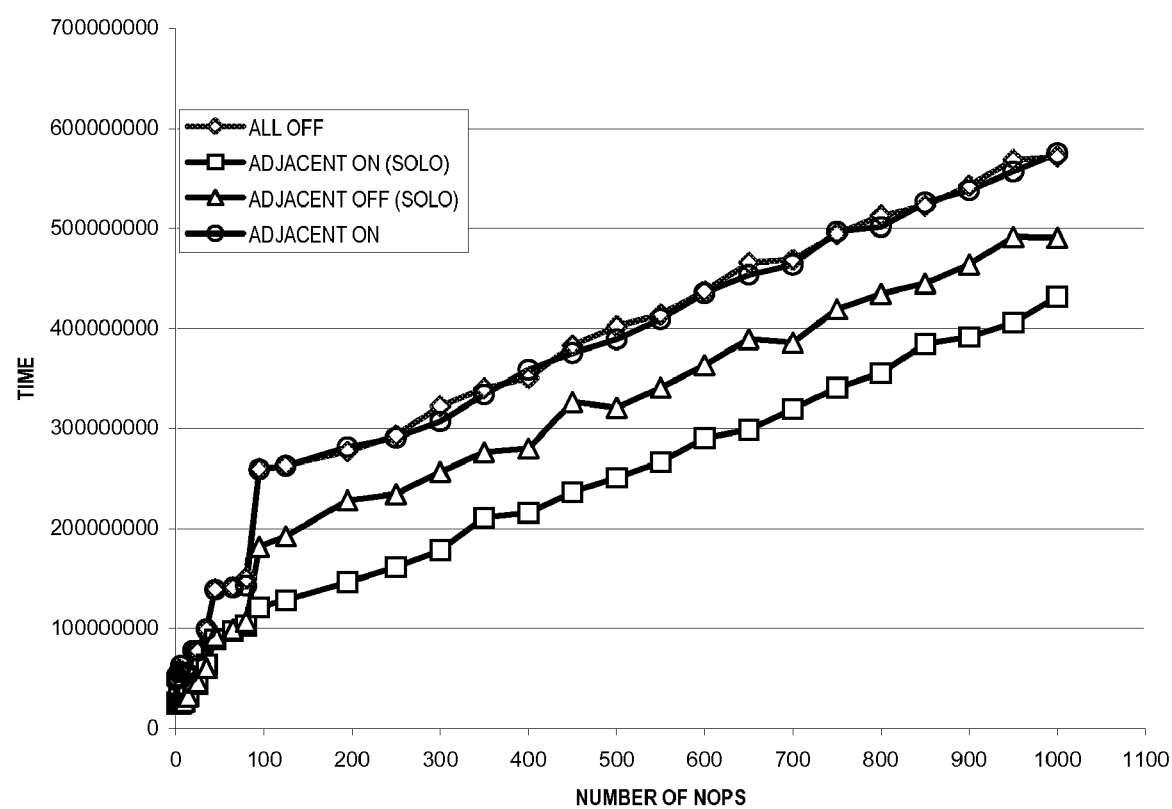
FIG. 6 is a graph of data collected during implementation of an IC characterization method for assessing a system-level operation thereof related to cache memory access operations of a multi-core microprocessor, in accordance with one embodiment of the invention.

FIG. 6 presents collected data generated via the test procedure in response to the bottleneck invoked thereby in managing cache memory access between cores. Namely, a graph of the execution time of the test is plotted as a function of the number of NOPs (N) for different cases. The "square line" is the case where the adjacent line pre-fetch is turned on and the second core is halted. The "triangle line" is the case where the adjacent line pre-fetch is turned off and the second core is halted. The "circle line" is the case where the adjacent line pre-fetch is turned on and the second core is producing misses. Finally, the "diamond line" is the case where the adjacent line pre-fetch is turned off and the second core is producing misses.

The above test results were evaluated as follows. With respect to the single core test results with pre-fetcher ON (squares, test scenario 1) and off (triangles, test scenario 2), it was determined that if the pre-fetcher is ON, a request for a plurality of memory segments comprising two (2) adjacent sectors is produced in response to a first cache miss. Further, if the number of NOPs is large enough to allow for completion of the transfer of two (2) adjacent sectors (around 150 NOPs), the completion of this transfer provides a visible performance improvement (square line is under triangle line when number of NOPs is greater then 150).

In the test scenarios where the second core constantly produces misses, the performance of the test program degraded overall because the front-side bus (FSB) needs to serve high priority transfers interfering with transfers needed for the test program. However, if the adjacent line pre-fetcher is ON, the performance pattern of the test program (circle line) is in line with the performance pattern of the single core test when the pre-fetcher is OFF; moreover, the performance pattern is not materially changed by turning the pre-fetcher OFF (i.e. circle line matches the diamond). Therefore, it is concluded from the test data that during test 3 (circle line), a transfer of a plurality of memory segments (comprising 2 adjacent cache line sectors) is initiated in response to a first miss and is stopped in response to a second miss generated on the second core; the second level (L2) cache then services the miss by transferring a cache line sector (i.e. second plurality of memory segments).

Figure 7:
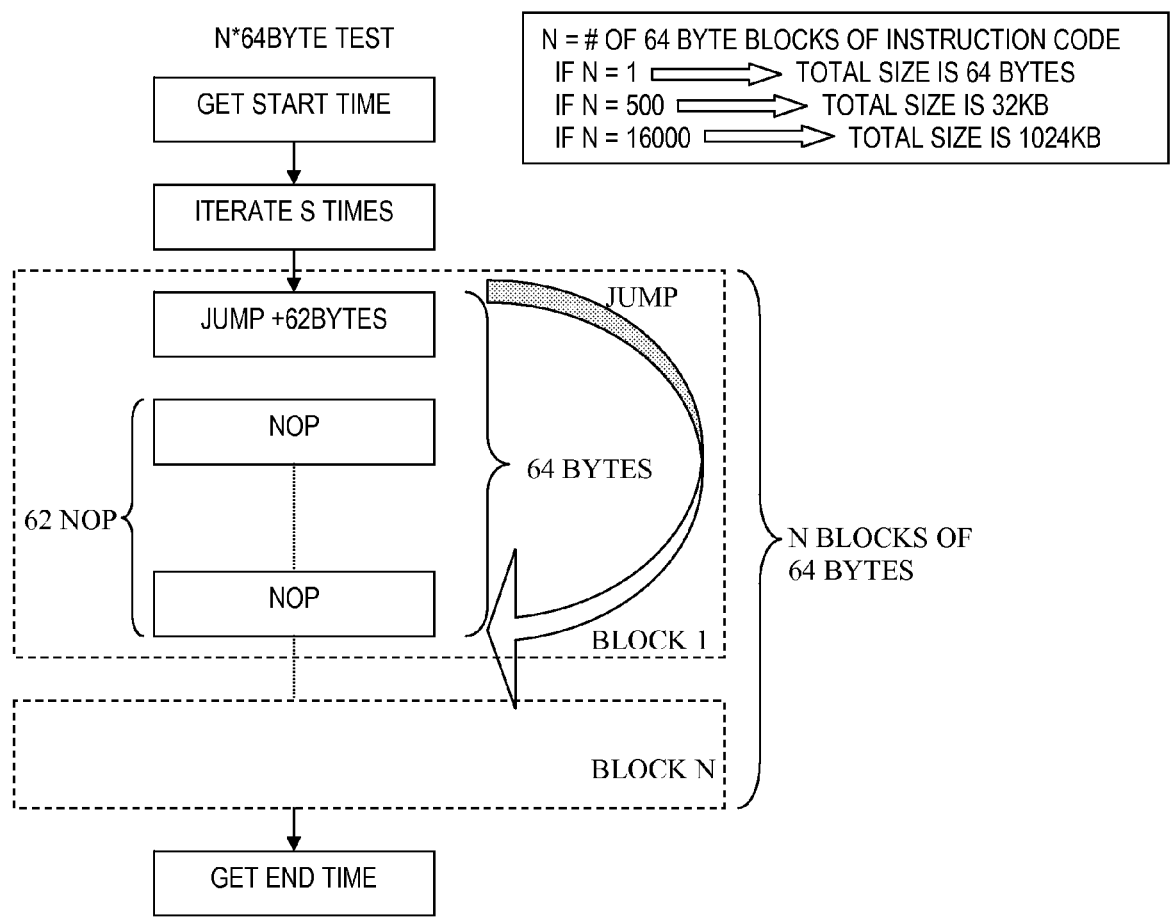
FIG. 7 is a flow chart of a test procedure to be simultaneously implemented on each core of a multi-core microprocessor to assess a system-level operation thereof related to parallel memory access operations, in accordance with one embodiment of the invention.

Referring now to FIG. 7, and in accordance with another embodiment of the invention, a method is provided for evaluating whether a multi-core processor is configured to enable multiple processor cores to retrieve instructions from memory in a given clock cycle. For example, the method of the present embodiment provides for a determination of the extent to which parallel access to cache memory may be achieved over sequential access. Using conventional benchmark testing methods, various test scenarios could be implemented to assess a performance of the processor under such conditions, however, it would remain unclear as to which system-level operational characteristic is at least partially responsible for the observed performance measures. Using the following method, while performance measures may be used to interpret operational efficiency, the implementation of an operational bottleneck configured to constrain operation of the IC to exhibit the system-level operation of interest enables or at least facilitates comparison of this observed operation with a pre-defined characteristic.

In this particular embodiment, an open source OS is modified for execution on the IC such that a test procedure, depicted in FIG. 7, can operate in an OS-free environment. That is, for this particular example, the OS is configured such that no interruptions are provided for graphics, drivers, etc. and no other programs are enabled to run to interfere with cache usage.

For the purpose of this example, the test procedure is implemented simultaneously on each core of a dual core processor to exhibit, if applicable, the parallel operation of the cache in response to each core. In this particular example, a first level cache (L1) of 32 Kb is associated with each core and a common second level cache (L2) of 2 Mb is shared between the cores. To constrain operation of the IC to exhibit the desired system-level operation of the IC, the test procedure is configured to invoke an operational bottleneck wherein implementation of the test procedure heavily depends on access to the level 2 cache. As depicted in FIG. 7, the test procedure records the processing time for implementing S iterations of an N-block test, wherein each block comprises a Jump (+62 bytes) followed by 62 NOPs. By implementing the test procedure for different values of N, the desired system-level operation of the IC can be exhibited for comparison with the pre-defined operational characteristic in question. For example, for N<500, access to the cache by a given core will be limited to the L1 cache, whereas for N=16000, about half of the L2 cache will be occupied. Depending on the level of accuracy desired, the number of iterations S for each N can be adjusted. Therefore, as will be apparent to the person skilled in the art, by collecting data associated with the program execution throughput with different data block settings, the sought out system-level operation of the IC can be exhibited.

The above provides various exemplary embodiments of the invention. Other such exemplary procedures, as will be apparent to the person of ordinary skill in the art, may also be considered herein without departing from the general scope and nature of the present disclosure. For example, a similar method may be implemented to evaluate whether a microprocessor can speculatively execute instructions on the return address of a current subroutine. To invoke an operational bottleneck enabling exhibition of such system-level operation, a test procedure was implemented to generate a side effect, wherein data is first loaded into the cache, and wherein a query—"is data cached"—is used as a proxy to a determination as to whether the instruction was speculatively executed (e.g. cache priming).

Another embodiment involves the evaluation of how a graphics processing unit (GPU) manages or schedules requests (i.e. just-in-time for intended results vs. as soon as possible irrespective of timing requirements), for instance, in order to optimize power consumption. In a particular example, a test procedure is implemented wherein a standard graphics benchmark is used to load the GPU, while rendering requirements are changed as a proxy to deadline adjustments, thereby generating an operational bottleneck between applied deadlines which constrains operation of the GPU so to enable the desired system-level operation thereof to be exhibited. To further highlight observation of the system-level operation, an RF probe is also used (e.g. to acquire further side-channel data) to monitor a load of the GPU in synchronization with the changing rendering parameters.

In yet another example, the system-level operation of a microprocessor can be tested as to whether several requests can be "bundled" in a small (e.g. 1 byte) area of memory in a single burst. In order to observe such system-level operation, the performance of the processor is monitored and compared in response to a test procedure configured to invoke an operational bottleneck exhibiting this operation by issuing a succession of small requests and burst requests.

It will be appreciated by the person skilled in the art that the above examples, as well as other such test procedures, may be considered herein without departing from the general scope and nature of the present disclosure.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

We claim:

1. A method of characterizing an integrated circuit (IC) using a computing device, for comparison with a pre-defined system-level characteristic related to an aspect of IC operation, the method comprising the steps of:
    executing a test procedure on the IC that invokes the aspect;
    invoking at least one operational bottleneck during said executing step, by allowing a component of the IC to constrain operation of the IC to exhibit a system-level operation thereof related to the aspect;
    collecting data generated via said test procedure in response to said bottleneck using the computing device; and
    comparing said system-level operation exhibited by said data for consistency with the pre-defined system-level characteristic using the computing device.

2. The method according to claim 1, wherein said data comprises side-channel data.

3. The method according to claim 1, wherein said test procedure is executed with the IC operating in an environment conducive to exhibiting a native operation thereof.

4. The method according to claim 1, wherein the pre-defined system-level characteristic is defined by an element of a patent claim relating to IC operation, and wherein said comparing step comprises evaluating whether operation of the IC is consistent with this patent claim clement.

5. The method according to claim 1, wherein said test procedure is executed with the IC operating in a substantially operating system (OS) free environment.

6. The method according to claim 5, wherein operating the integrated circuit in a substantially OS free environment comprises the steps of:
providing an open source operating system;
adjusting said open source operating system to remove at least one parameter that in operation obscures a native operation of the IC; and
executing the adjusted open source operating system on the IC.

7. The method according to claim 1, wherein the aspect is selected from memory management and power management.

8. The method according to claim 1, wherein said bottleneck is invoked by said test procedure.

9. The method according to claim 1, wherein said bottleneck is invoked distinctly from said test procedure.

10. The method according to claim 1, wherein the pre-defined system-level characteristic comprises a functional characteristic as defined by a descriptive document.

11. The method according to claim 1, wherein said test procedure comprises a benchmark test.

12. A system for characterizing an integrated circuit (IC) for comparison with a pre-defined characteristic related to an aspect of IC operation, the system comprising:
a computer-readable medium comprising statements and instructions for execution by the system on the IC to implement a test procedure configured to invoke the aspect, while invoking at least one operational bottleneck, by allowing a component of the IC to constrain operation of the IC to exhibit a system-level operation thereof related to the aspect;
a data storage device for collecting data generated via said test procedure in response to said bottleneck; and
an output for enabling comparison of said system-level operation exhibited by said data for consistency with the pre-defined characteristic.

13. The system of claim 12, further comprising an operating system (OS) configured to enable execution of said test procedure on the IC.

14. The system according to claim 13, wherein said OS is configured to enable execution of said test procedure in a substantially OS-free environment.

15. The system according to claim 13, wherein said OS comprises a Linux-based OS.

16. The system according to claim 13, wherein said OS comprises interrupts disabled.

17. The system according to claim 13, wherein said OS comprises at least one uninitialized peripheral device.

18. The system according to claim 12, wherein said data comprises side-channel data.

19. The system according to claim 12, wherein said test procedure comprises a benchmark test.

20. A non-transitory computer-readable medium comprising statements and instructions for execution by an integrated circuit (IC) for characterizing the IC for comparison with a pre-defined system-level characteristic related to an aspect of IC operation in accordance with the following steps of:
executing a test procedure on the IC configured to invoke the aspect;
invoking at least one operational bottleneck during said executing step, by allowing a component of the IC to constrain operation of the IC to exhibit a system-level operation thereof related to the aspect;
collecting data generated via said test procedure in response to said bottleneck;
and accessing said data to enable comparison of said system-level operation exhibited
thereby for consistency with the pre-defined system-level characteristic.

21. The non-transitory computer-readable medium according to claim 20, wherein said data comprises side-channel data.

22. The non-transitory computer-readable medium according to claim 20, further comprising statements and instructions for executing said test procedure with the IC operating in a substantially operating system (OS) free environment.

23. The non-transitory computer-readable medium according to claim 20, further comprising statements and instructions wherein operating the IC in a substantially OS free environment comprises executing a revised open source operating system on the IC for which at least one parameter is removed which, in operation, obscures a native operation of the IC.

* * * * *